United States Patent [19]

Imamura et al.

[11] Patent Number: 4,947,020
[45] Date of Patent: Aug. 7, 1990

[54] TRIMMING ELEMENT FOR MICROELECTRIC CIRCUIT

[75] Inventors: Kaoru Imamura, Kawasaki; Wataru Takahashi, Tokyo, both of Japan

[73] Assignee: Kabushiki Kaisha Toshiba, Kawasaki, Japan

[21] Appl. No.: 298,131

[22] Filed: Jan. 18, 1989

[30] Foreign Application Priority Data

Jan. 20, 1988 [JP] Japan .................................. 63-10293

[51] Int. Cl.$^5$ .............................................. B23K 76/00
[52] U.S. Cl. ............................ 219/121.65; 219/121.6
[58] Field of Search ...................... 219/121.65, 121.66, 219/121.6, 12.85; 338/195

[56] References Cited

U.S. PATENT DOCUMENTS

| | | | |
|---|---|---|---|
| 4,584,456 | 4/1986 | Oodaira et al. | 219/121.66 X |
| 4,636,404 | 1/1987 | Raffel et al. | 219/121.85 X |
| 4,665,295 | 5/1987 | McDavid | 219/121.85 |
| 4,694,138 | 8/1987 | Oodaira et al. | 219/121.66 X |

Primary Examiner—C. L. Albritton
Attorney, Agent, or Firm—Finnegan, Henderson, Farabow, Garrett and Dunner

[57] ABSTRACT

A trimming element comprises (a) a medium layer, (b) a pair of electrodes connected to the medium layer, and (c) an alloy layer, which is formed of metal of the electrodes and material of the medium layer and is created in the medium layer, for substantially short-circuiting the electrodes to each other. The alloy layer is obtained by applying a laser beam to the medium layer to heat a portion between the electrodes. The metal layer for substantially short-circuiting the electrodes is thus formed.

20 Claims, 5 Drawing Sheets

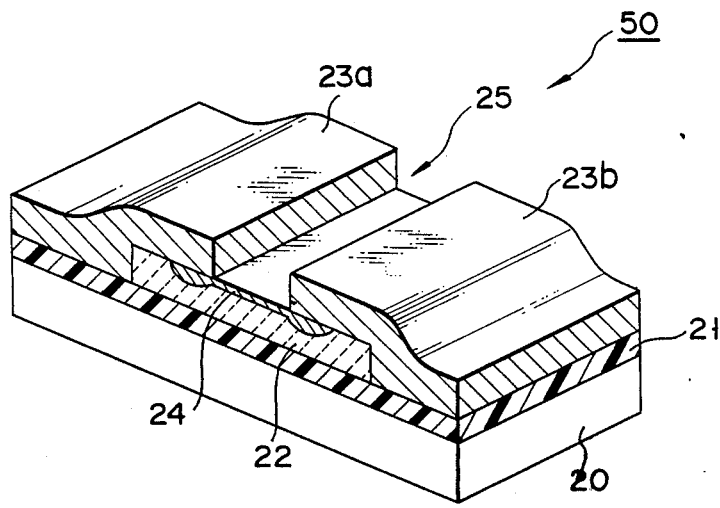
FIG. 1
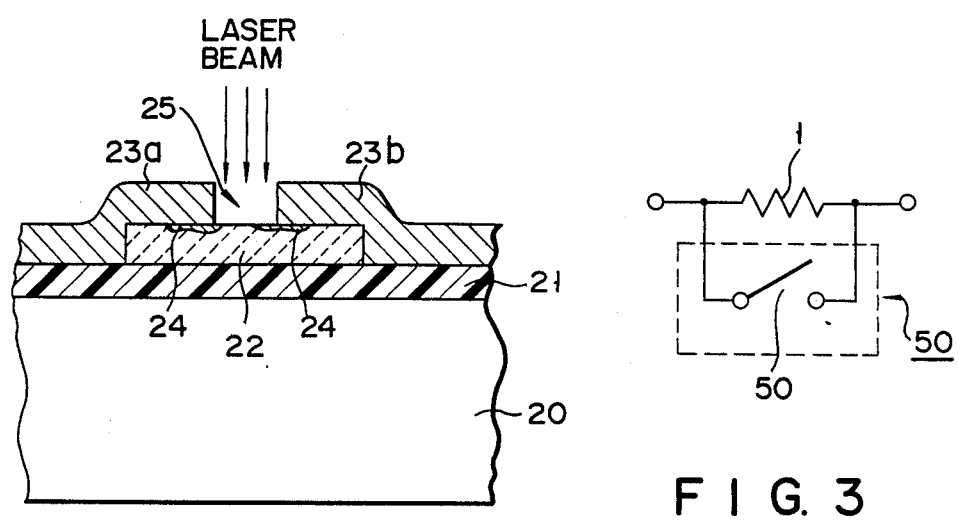
FIG. 2
FIG. 3

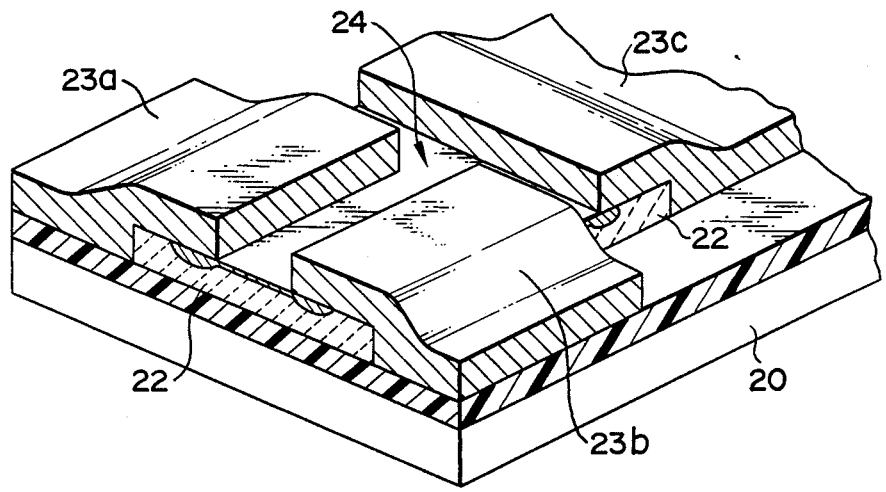
F I G. 11
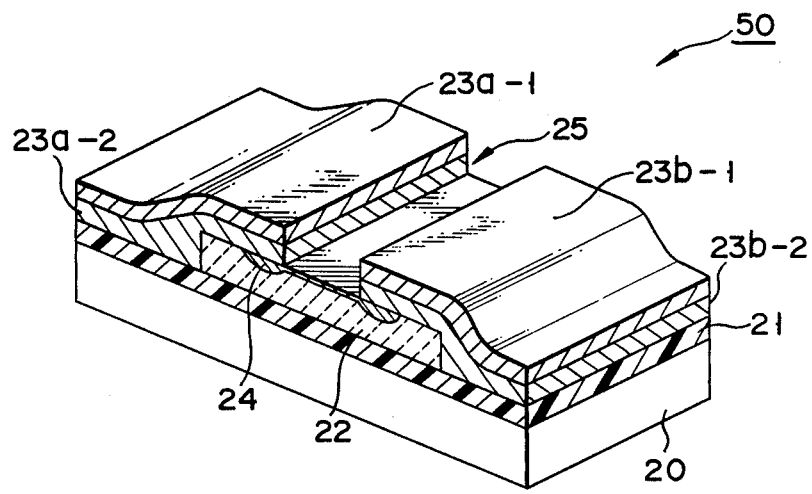
F I G. 12

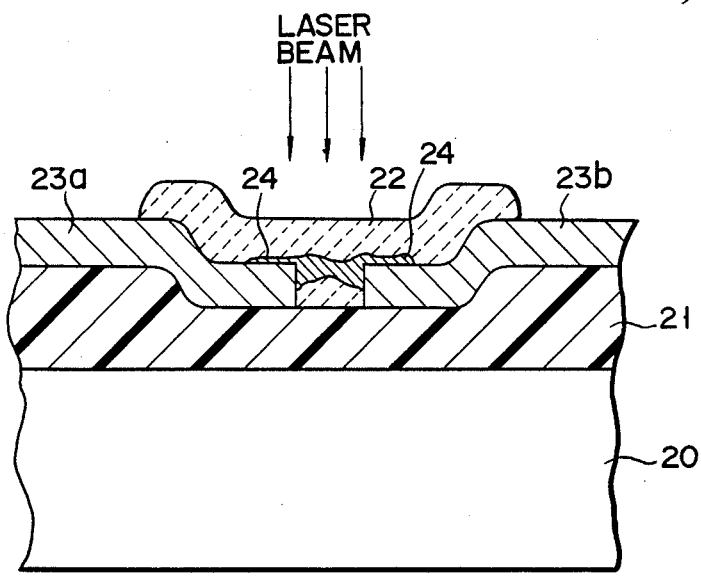
F I G. 13
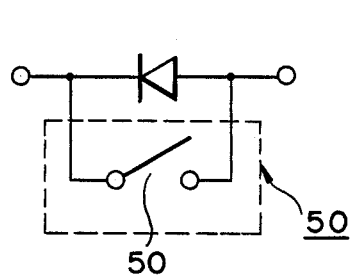
F I G. 14
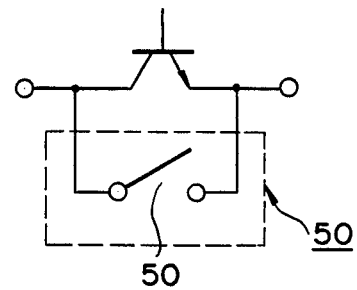
F I G. 15

TRIMMING ELEMENT FOR MICROELECTRIC CIRCUIT

BACKGROUND OF THE INVENTION

1. Field of the Invention

This invention relates to a trimming element used for, for example, microcircuits such as thin-film or thick-film integrated circuits, and more particularly to a trimming element used for short-circuiting part of a network such as active circuit elements (transistors and the like) and passive circuit elements (resistors, capacitors, inductors and the like) in redundancy processing or a functional trimming.

2. Description of the Related Art

Recently, in the monolithic semiconductor integrated circuit and hybrid integrated circuit, a functional trimming process has received much attention as a means of attaining output characteristics of high precision, for example, a high precision D/A conversion output characteristic in the case of a D/A converter.

The trimming process utilizing a laser beam can be effected with the trimming device electrically separated from to-be-trimmed material. Therefore, it is possible to cut or melt the to-be-trimmed element, a for example, resistor which is used as the main factor to determine the output characteristic of a circuit, by use of a laser beam while the circuit is set in the operative condition and the output characteristic is observed. Thus, the trimming operation can be effected to adjust the resistance until a desired output characteristic can be attained, thereby obtaining precision output characteristic. Such a trimming operation is called functional trimming.

Various trimming methods for adjusting the resistance have been proposed. One trimming method is to use short bars 2 respectively connected in parallel with series-connected diffusion resistor elements or thin film resistor elements 1 as shown in a circuit of FIG. 8A. Short bars 2 are sequentially cut apart (indicated by mark x) to adjust the resistance between two terminals A and B. The other trimming method is shown in FIG. 8B. FIG. 8B is a plan view of thin film resistor 4, and 3 denotes a metal electrode. With this method, the resistance can be adjusted by forming a groove in a resistance film to change the direction of electrode lines of force.

In the two trimming methods described above with reference to FIGS. 8A and 8B, the resistor is trimmed so as to increase the resistance thereof, and it is impossible to reduce the resistance. Therefore, when the trimming process is effected to change the resistance and if the resistance exceeds a desired resistance value, it becomes impossible to attain the desired resistance value.

In particular, in the short bar cutting system shown in FIG. 8A, since the resistance of the resistor may be made different according to various factors in the manufacturing process, there is a high possibility that the resultant resistance may be made larger than the desired resistance value in the resistance adjusting process. In order to solve this problem, the trimming resistor is set to an initial value which is sufficiently smaller than the desired value so that the resistance adjustment range can be set sufficiently large. Further, in this case, variation in resistance in each cutting operation is set to a small value in order to attain a fine resistance adjustment. However, in this method, the occupied area of the trimming resistor on the IC chip may increase, making this method impractical.

Further, there is provided a method in which PN junction diodes respectively connected in parallel with the resistors are used as a means for reducing the resistance of the resistor by the trimming process. FIG. 9 shows the means in the form of an electrical circuit. With this circuit, resistor 7 may be short-circuited to reduce the resultant resistance by applying a laser beam to PN junction diode 6 to thermally destroy the PN junction thereof and break the rectification characteristic thereof. However, in this method, it is necessary to provide a region which insulatively isolates the diode from the other circuit elements. As a result, the occupied area of the trimming resistor is increased and the number of manufacturing steps will increase because of addition of the insulation isolation step, thus making this method impractical.

In a semiconductor device shown by the sectional view of FIG. 10, the upper portion of a wafer is used as emitter layer 8, and the lower portion of the wafer is used as N-type collector layer 10 with P-type base layer 9 disposed therebetween. Further, a short-circuiting diode with N-type layer 11 and P-type layer 12 is formed in the same wafer. In this case, in order to insulatively isolate collector layer 10 from the short-circuiting diode, it is necessary to provide dielectric isolation layer 13 or PN isolation diffusion layer 13, causing a practical disadvantage.

When the short bar cutting method shown in FIG. 8A or groove forming method shown in FIG. 8B is used among the trimming methods for adjusting the resistance, the resistance can be adjusted only in an increasing direction. For this reason, in a case where the resultant resistance is set to within the desired resistance range, it is necessary to significantly increase the occupied area of the trimming resistor. Further, in the method in which diodes are connected in parallel with the resistors as shown in FIG. 9 and the resultant resistance can be reduced by the trimming operation, it is necessary to provide a complicated isolation structure as shown in FIG. 10 in order to attain the insulative isolation between the diode and the other circuit element.

SUMMARY OF THE INVENTION

An object of this invention is to provide a trimming element which can reduce the resultant resistance obtained by the trimming operation and which can be easily manufactured while eliminating the necessity of employing a complicated isolation structure.

A trimming element of this invention comprises: (a) a medium layer (22); (b) a pair of electrodes (23a, 23b) connected to the medium layer (22); and (c) an alloy layer (24), which is formed of metal of the electrodes (23a, 23b) and material of the medium layer (22) and is created in the medium layer (22), for substantially short-circuiting the electrodes (23a, 23b) to each other.

The alloy layer (24) can be obtained by applying a laser beam to the medium layer (22) to heat a portion between the electrodes (23a, 23b). In this way, the metal layer (24) for substantially short-circuiting the electrodes (23a, 23b) is formed.

The medium layer (22) is formed of an insulation layer such as a polysilicon layer or pure silicon layer, or a resistive layer such as a polysilicon layer having a predetermined amount of impurity contained therein. In most cases, a plurality of electrodes (23a, 23b) are formed as part of a wiring pattern, but may be formed of metal films separately formed to form the wiring pattern. The electrodes (23a, 23b) are arranged at a regular interval and connected to the medium layer. In a case where the trimming element is incorporated in an integrated circuit, the electrodes (23a, 23b) are connected to a circuit element or wiring pattern.

When a laser beam is applied to the medium layer (22) between the electrodes (23a, 23b), the medium layer (22) is heated to create alloy (for example, Al-Si alloy) between the material of the medium layer (22) and the electrode metal (23a, 23b) set in contact with the medium layer (22). The alloy layer (24) grows mainly in a thickness direction and lateral direction of the medium layer, from the contact surface between the electrodes (23a, 23b) and the medium layer (22). More specifically, the alloy layers grow from the electrodes (23a, 23b) and are connected to each other so that the electrodes (23a, 23b) can be connected to each other, the alloy layers.

Therefore, in the case where the medium layer (22) is an insulative layer, the trimming element has the same function as a switch which is turned off before the alloy layer is formed and turned on after the alloy layer (24) is formed. Further, even when the medium layer (22) is formed of a resistive layer of preset resistance (for example, a doped polysilicon layer), the trimming element can have the same function as the trimming element obtained in the case where the medium layer is formed of the insulative layer, except that the resistive layer has a predetermined OFF-resistance before the alloy layer is formed. That is, in either case, the resistance can be reduced by applying a laser beam in the trimming process.

BRIEF DESCRIPTION OF THE DRAWINGS

FIG. 1 is a perspective view showing the structure of a trimming element according to one embodiment of this invention;

FIG. 2 is a sectional view for illustrating the process for short-circuiting electrodes of the trimming element by applying a laser beam;

FIG. 3 shows an equivalent circuit of the trimming element of FIG. 1, to which a resistor is connected;

FIG. 11 is a perspective view showing a modification of the embodiment of FIG. 1 wherein three electrodes (23a, 23b, 23c) are electrically short-circuited via an alloy layer (24) formed by a trimming operation;

FIG. 12 is a perspective view showing another modification of the embodiment of FIG. 1 wherein two electrodes (23a, 23b) have a two-layered structure;

FIG. 13 is a sectional view showing a modification of the embodiment of FIG. 2 wherein a polysilicon layer (22) which can form alloy (24) together with the metal material of electrodes (23a, 23b) is formed on the electrodes;

FIG. 14 shows an equivalent circuit of the trimming element of FIG. 1, to which a diode is connected; and FIG. 15 shows an equivalent circuit of the trimming element of FIG. 1, to which a transistor is connected.

DETAILED DESCRIPTION OF THE PREFERRED EMBODIMENTS

Figure 4:
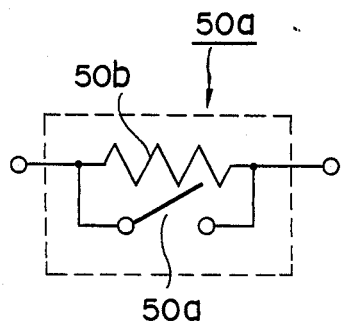
FIG. 4 shows an equivalent circuit of the trimming element of FIG. 1 having a resistor disposed between the electrodes.

There will now be described an embodiment of this invention with reference to the accompanying drawings. FIG. 1 is perspective view of a trimming element according to one embodiment of this invention and FIG. 2 is a sectional view showing the trimming element obtained in the process of forming the alloy layer. Trimming element 50 is formed on insulation film (SiO$_2$ film) 21 which is formed on semiconductor substrate 20. Medium layer 22 is formed of high resistance polysilicon layer 22 of about 5000 Å thickness containing little impurity. Polysilicon layer 22 is connected to electrodes 23a and 23b which are formed of an aluminum layer of 4 μm thickness and are separately disposed with preset distance 25.

Reference numeral 24 denotes an Al-Si alloy layer of low resistance for substantially short-circuiting Al electrodes 23a and 23b to each other Al-Si layer 24 is formed by causing alloy of Al of electrodes 23a and 23b and Si of polysilicon layer 22 to grow in a transverse direction of the polysilicon layer which is heated in the trimming process. Trimming element 50 includes polysilicon layer 22, electrode 23a and 23b, and alloy layer 24.

Thus, electrode 23a and 23b are substantially isolated from each other by high resistance polysilicon layer 22 which is an insulation material before the trimming process. As a result, the electrical circuit is made open.

As shown in FIG. 2, in the trimming process, a laser beam is applied to polysilicon layer 22 via a space between electrodes 23a and 23b. When absorbing the light energy of laser beam, polysilicon layer 22 generates heat. Since Al electrodes 23a and 23b have a heat conductivity higher than polysilicon layer 22 and the light energy of laser beam directly absorbed by the electrodes is small, the electrodes are kept at a relatively low temperature. As a result, that portion of polysilicon layer 22 which corresponds to space 25 generates the largest amount of heat and is set to a high temperature. Then, alloy layer (which is also called sinter layer) 24 of Al and Si starts to grow at the contact surfaces between the polysilicon layer portion and the electrodes.

The laser beam is further applied to cause alloy layer 24 to grow not only in a thickness direction of polysilicon layer 22 but also in a transverse direction thereof. After a certain amount of laser beam has been applied, alloy layers 24 which has grown from directly under electrodes 23a and 23b come into contact with each other. When this condition is reached, electrodes 23a and 23b are short-circuited with each other by means of Al-Si alloy layer 24.

FIG. 3 shows an equivalent circuit representing the function of trimming element 50. In FIG. 3, trimming element 50 is surrounded by broken lines and is represented as switch 50 connected in parallel with resistor element 1. Switch 50 is kept in the open off) condition before the trimming process effected by applying the laser beam and is changed to an electrically short-circuiting (on) condition by applying the laser beam.

In FIG. 3, if a passive or active element or an electric network including such the element is used instead of resistor element 1, trimming element 50 can still have the function of short-circuiting the element or network. The examples are shown in FIGS. 14 and 15.

Next, the function of trimming element 50a which has a polysilicon layer containing a preset amount of impurity instead of polysilicon layer 22 containing little impurity is explained with reference to an equivalent circuit of FIG. 4. In FIG. 4, element 50a is surrounded by broken lines. Element 50a is represented by resistor 50b having a resistance corresponding to the preset amount of impurity and switch 50a connected in parallel with each other before the trimming process.

That is, switch 50a is set in the off condition before fore the trimming process and trimming element 50a has the function of a resistor element. After the trimming process effected by application of a laser beam, switch 50a is turned on and it has the function of a short bar.

Figure 5:
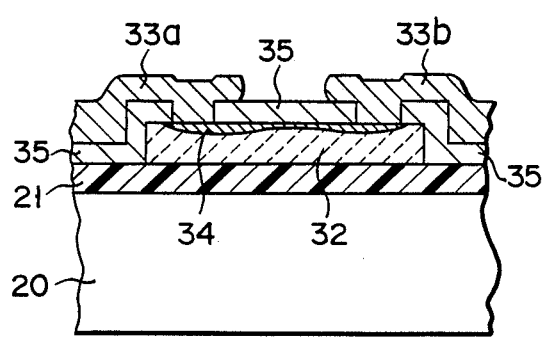
FIG. 5 is a sectional view showing the structure of a trimming element according to another embodiment of this invention.

In FIG. 2, Al electrodes 23a and 23b are separately disposed, but it is possible to dispose insulation film 35 between Al electrodes 33a and 33b as shown in FIG. 5. In this case, alloy layer 34 is created along the interface between polysilicon layer 32 and inclusion layer 35 in the trimming process, and the same effect as was obtained in the embodiment of FIG. 1 can be attained.

Figure 6A:
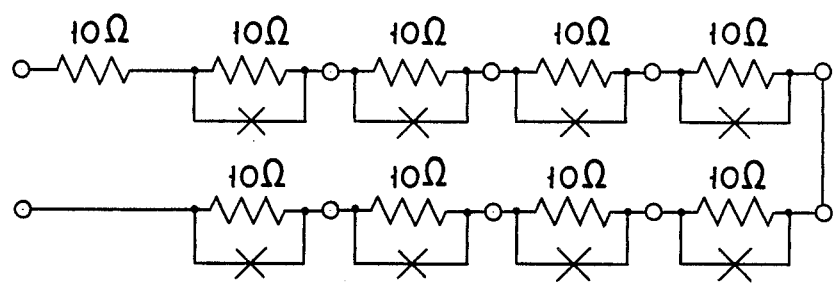
FIG. 6A shows an example of a resistor trimming circuit to which this invention is applied.
Figure 6B:
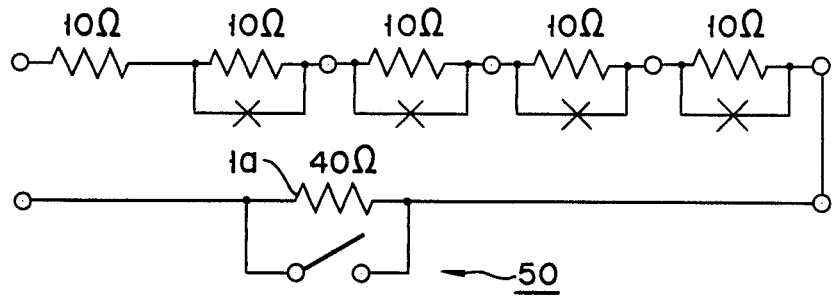
FIG. 6B shows an example of a resistor trimming

Now, an example in which the resistance-reducing function of the trimming element of this invention is explained. Assume that the resistance of the resistor can be changed from 10 Ω to 90 Ω by a unit of 10 Ω, for example, in the trimming process. In this case, in the conventional resistance-increasing method, it becomes necessary to variably set all the resistance values of 10 Ω to 90 Ω as shown in FIG. 6A. In contrast, as shown in FIG. 6b, according to this invention, resistor element 1a of 40 Ω connected in parallel with trimming element 50 of this invention is connected in series with a trimming resistor element which can be varied from 10 Ω to 50 Ω. In most cases, the formation area of the trimming resistor with the structure of FIG. 6B can be made smaller, thus reducing the chip size and lowering the cost thereof.

Figure 7:
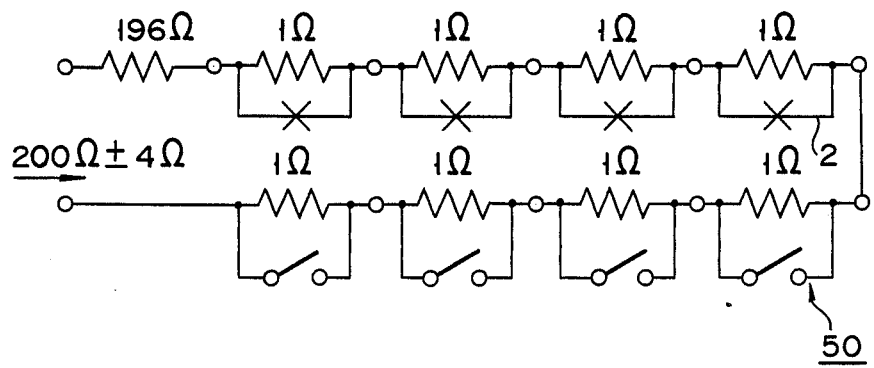
FIG. 7 shows another example of a resistor trimming circuit to which this invention is applied.
Figure 8A:
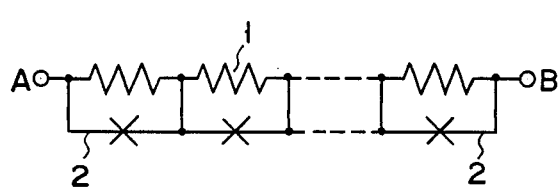
FIGS. 8A and 8B show examples of the conventional resistor trimming circuit and trimming resistor.
Figure 8B:
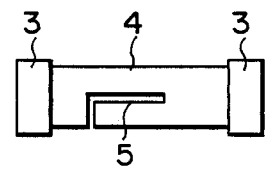
Figure 9:
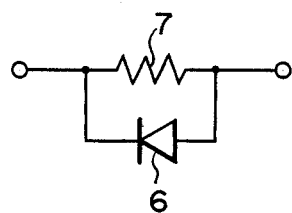
FIG. 9 show a conventional equivalent circuit resistor trimming circuit wherein a short-circuitable diode is connected in parallel to a resistor.
Figure 10:
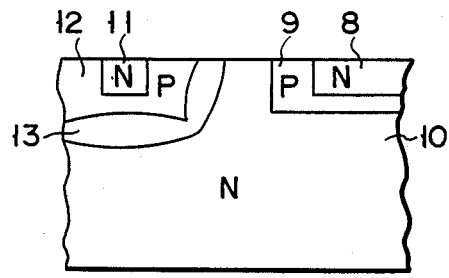
FIG. 10 shows an example of the sectional structure of an IC which is obtained by integrating the resistor trimming element of FIG. 9.

Further, even if the resistance exceeds the desired value at the time of resistor formation, the resistance can be further adjusted by using the trimming element of this invention, thus improving the manufacturing yield in comparison with the conventional case. FIG. 7 shows an example of the case wherein a resistor having the desired resistance value of 200 Ω is formed. The circuit construction of FIG. 7 is obtained by serially connecting a plurality of parallel circuits each having a 1 Ω-resistance element and element 50 of this invention with a plurality of parallel circuits each having a 1 Ω-resistance element and short bar 2. In the case of FIG. 7, the resistance can be adjusted from 196 Ω to 204 Ω.

The effect attained in the trimming process has been described. However, it is possible to use the trimming element of this invention to short circuit the redundant circuit in the redundancy process.

FIG. 11 is a perspective view of a modification of the embodiment shown in FIG. 1. In this case, three electrodes 23a, 23i b and 23c are short-circuited by alloy layers 24 formed by the trimming process.

The number of electrodes 23 which can be short-circuited by means of alloy layer 24, is not limited to two or three as shown in the case of FIG. 1 or FIG. 11. However, it is possible to dispose, around alloy layer 24, four or more electrodes which can be selectively short-circuited in the trimming process. For example, it is possible to dispose medium layer 22 which selectively short-circuits two or more electrodes 23 at each of intersections of wiring lines arranged in the matrix form.

FIG. 12 is a perspective view showing anther modification of the embodiment of FIG. 1. In this modification, electrodes 23a and 23b of two-layered structure are used. For example, Al layers 23a-1 and 23b-1 are respectively formed on Ti layers 23a-2 and 23b-2. Such two-layered electrodes can be used in this invention. In a case where the two-layered structure of Al/Ti is used sinter layer 24 which grows in polysilicon layer 22 is formed of an Al-Ti-Si alloy layer. The lower layer of Ti of the two-layered electrode can be replaced by a layer of refractory metal such as W or Mo.

When an insulative film is formed as medium layer 22, pure silicon or polysilicon is used for the material thereof. When a resistor layer is formed as medium layer 22, doped silicon or doped polysilicon containing highly doped impurity may be used as the material.

When a resistor layer is formed as medium layer 22, it is possible to utilize Joule heat in place of the laser beam (or together with the laser beam) as a means of creating alloy layer 24 In the case of utilizing the Joule heat, current is caused to flow across electrodes 23a and 23b to heat the resistor between the electrodes.

In the case of using the laser beam for creating alloy layer 24, the surface of medium layer 22 may be subjected to a bloackening process in order that medium layer 22 can easily absorb the light energy.

FIG. 13 is a sectional view of a modification of the embodiment of FIG. 2. In this case, polysilicon layer 22 is formed on electrodes 23a and 23b. The structure corresponds to that obtained by reversing the position of polysilicon layer 22 and electrodes 23a and 23b. With this construction, alloy layer 24 of metal material of electrodes 23a and 23b can be created in polysilicon layer 2 by effecting the layer trimming process.

In the embodiments of FIGS. 1, 5, 11, 12 and 13, electrode material Al may be replaced by other material (creating a conductive alloy together with medium 22) such as Au or Pt.

Further, the material of substrate 20 is not limited to Si, but a semiconductor substrate of GaAs, Ge or the like may be used. Also, an insulation substrate of sapphire or the like can be used as substrate 20.

Insulative material such as Si nitride, thermal oxide of chemical vapor deposition (CVD) Si, boron silicate glass and, phospho-silicate glass (PSG) may be used as the material of insulation film of FIG. 5.

The trimming element of this invention can be conveniently used to trim the resistor array in an A/D converter constituted by a monolithic IC or hybrids IC or to adjust the off-set of an operation amplifier.

As described above, the resistance of the trimming resistor can be reduced in the trimming process by utilizing this invention. Further, it is only necessary to form the trimming element on the insulation film. Thus, the trimming element can be provided in which the resistance reducing function can be attained at low cost by the trimming process without using complicated PN junction isolation or insulative isolation.

While the invention has been described in connection with what is presently considered to be the most practical and preferred embodiment, it is to be understood that the invention is not limited to the disclosed embodiment but, on the contrary, is intended to cover various modifications and equivalent arrangements included within the scope of the appended claims, which scope is to be accorded the broadest interpretation so as to encompass all such modifications and equivalent arrangements.

What is claimed is:

1. A trimming element comprising:
   a first electrode formed of conductive material;
   a second electrode formed of conductive material and disposed separately from said first electrode to face said first electrode;
   a medium section formed partly in contact with said first and second electrodes and formed of material which creates a conductive alloy layer together with said conductive material when said medium section is heated, said first and second electrodes and said medium section being exposed such that a portion of said first and second electrodes and said medium section are adapted to directly receive a laser beam; and
   supporting means for mechanically supporting said first and second electrodes and said medium section.

2. A trimming element according to claim 1, wherein said medium section is formed of insulative material, and said conductive alloy layer is formed in said medium section by applying a laser beam to heat part of said medium section which lies in a gap between said first and second electrodes.

3. A trimming element according to claim 1, wherein said medium section itself is formed of conductive material, and said conductive alloy layer is formed in said medium section by supplying a current across said first and second electrode to generate Joule heat in part of said medium section which lies in a gap between said first and second electrode.

4. A trimming element according to claim 1, wherein the material of said first and second electrodes includes aluminum, gold or platinum.

5. A trimming element according to claim 1, wherein said first and second electrodes each have a single layered structure.

6. A trimming element according to claim 1, wherein said first and second electrodes each have a two-layered structure formed of an upper layer and a lower layer.

7. A trimming element according to claim 6, wherein the material of said upper layers of said first and second electrodes includes aluminum, gold or platinum.

8. A trimming element according to claim 7, wherein the material of said lower layers of said first and second electrodes includes refractory metal.

9. A trimming element according to claim 1, wherein a resistive component is connected between said first and second electrodes.

10. A trimming element according to claim 1, wherein said first and second electrodes are connected in series with a resistor circuit whose resistance may be increased by a trimming process.

11. A trimming element according to claim 1, wherein a diode component is connected between said first and second electrodes.

12. A trimming element according to claim 1, wherein a transistor component is connected between said first and second electrodes.

13. A trimming element according to claim 1, wherein an insulation layer is disposed between said first and second electrodes, said medium section is formed under said insulation layer, and said conductive alloy layer is formed between said insulation layer and said medium section.

14. A trimming element according to claim 1, wherein said medium section is formed of polysilicon.

15. A trimming element according to claim 1, wherein said medium section is formed of silicon.

16. A trimming element according to claim 1, wherein said medium section is formed of polysilicon doped with a impurity.

17. A trimming element according to claim 1, wherein said medium section is formed of silicon doped with an impurity.

18. A trimming element according to claim 1, wherein said supporting means includes a substrate and an insulation layer formed on said substrate; and said first and second electrodes and said medium section are supported on said insulation layer.

19. A trimming element comprising:
   a medium layer;
   a plurality of electrodes connected to said medium layer; and
   an alloy layer, created in said medium layer, formed of metal material of said plurality of electrodes and material of said medium layer, for substantially short-circuiting said plurality of electrodes to one another, said plurality of electrodes and said medium layer being exposed such that a portion of said plurality of electrodes and said medium layer are adapted to directly receive a laser beam.

20. A trimming element according to claim 19, wherein said alloy layer is created by applying a laser beam to said medium layer to substantially short-circuit said plurality of electrodes.

* * * * *